US006968829B2

(12) United States Patent
Joos et al.

(10) Patent No.: US 6,968,829 B2
(45) Date of Patent: Nov. 29, 2005

(54) METHOD, COMPUTER PROGRAM, MEMORY MEDIUM, AND CONTROL AND/OR REGULATING DEVICE FOR OPERATING AN INTERNAL COMBUSTION ENGINE, AND AN INTERNAL COMBUSTION ENGINE IN PARTICULAR FOR A MOTOR VEHICLE

(75) Inventors: Klaus Joos, Walheim (DE); Thomas Frenz, Noerdlingen (DE); Markus Amler, Leonberg-Gebersheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/766,668

(22) Filed: Jan. 27, 2004

(65) Prior Publication Data

US 2004/0255910 A1 Dec. 23, 2004

(30) Foreign Application Priority Data

Jan. 30, 2003 (DE) ................................ 103 03 573

(51) Int. Cl.[7] ........................ F02M 51/00; H01L 41/09
(52) U.S. Cl. ....................................... 123/490; 310/317
(58) Field of Search ................................ 123/299, 300, 123/446, 467, 478, 480, 486, 490, 498; 324/522; 310/311, 317; 701/104, 105

(56) References Cited

U.S. PATENT DOCUMENTS

| | | | | |
|---|---|---|---|---|
| 6,253,736 | B1 * | 7/2001 | Crofts et al. | 123/498 |
| 6,499,464 | B2 * | 12/2002 | Rueger | 123/446 |
| 6,532,942 | B2 * | 3/2003 | Zumstrull | 123/498 |
| 6,619,268 | B2 * | 9/2003 | Rueger et al. | 123/490 |
| 2002/0083918 | A1 * | 7/2002 | Schoenfelder et al. | 123/299 |
| 2004/0008032 | A1 * | 1/2004 | Rueger et al. | 324/522 |

FOREIGN PATENT DOCUMENTS

| | | |
|---|---|---|
| DE | 101 48 217 | 4/2003 |

* cited by examiner

*Primary Examiner*—Willis R. Wolfe, Jr.
(74) *Attorney, Agent, or Firm*—Kenyon & Kenyon

(57) ABSTRACT

A method for operating an internal combustion engine is described, in which fuel is injected by an injector into a combustion chamber. The injector has an activatable piezoactuator. In the method, a precontrol setpoint for activating the piezoactuator is generated. The precontrol setpoint is combined with a charge regulation of the charge quantity conveyed to the piezoactuator.

15 Claims, 4 Drawing Sheets

METHOD, COMPUTER PROGRAM, MEMORY MEDIUM, AND CONTROL AND/OR REGULATING DEVICE FOR OPERATING AN INTERNAL COMBUSTION ENGINE, AND AN INTERNAL COMBUSTION ENGINE IN PARTICULAR FOR A MOTOR VEHICLE

FIELD OF THE INVENTION

The present invention relates to a method for operating an internal combustion engine in which fuel is injected by an injector into a combustion chamber, the injector having an activatable piezoactuator; and in which a precontrol setpoint for activating the piezoactuator is generated. The present invention also relates to a computer program, a memory medium, a control and/or regulating device, and an internal combustion engine in particular for a motor vehicle.

BACKGROUND INFORMATION

A method of this kind is described in German Patent No. DE 101 48 217.5, in which an injector whose valve needle is joined to a piezoactuator is provided for the injection of fuel. When a voltage is applied to the piezoactuator, it experiences a change in length that it transfers to the valve needle. The latter therefore lifts off from its valve seat so that fuel under high pressure can be injected from the injector into the combustion chamber of the internal combustion engine.

In order to activate the piezoactuator, provision is made for generation, by a precontrol operation, of a setpoint which not only is dependent on the desired mass or quantity of fuel to be injected, but in which further influencing variables that might result in a distortion of the setpoint are also taken into account. Such influencing variables are, for example, the temperature of the injector or aging thereof, or the like.

SUMMARY

An object of the present invention is to develop a method in which the fuel is injected even more precisely.

According to the present invention this object may be achieved, in the context of a method of the kind cited above, in that the precontrol setpoint is combined with a charge regulation of the charge quantity conveyed to the piezoactuator. The object may be achieved according to the present invention correspondingly in the context of a computer program, a memory medium, a control and/or regulating device, and an internal combustion engine.

As a result of the charge regulation, the piezoactuator and therefore the quantity of fuel to be injected can be adjusted by the method according to the present invention with very high precision. This, on the one hand, has a favorable effect on the fuel consumption of the internal combustion engine, but on the other hand also results in better emissions characteristics of an internal combustion engine operated in this fashion.

In a particularly advantageous embodiment of the present invention, a reference stroke and an actual stroke of the valve needle of the injector are combined with one another, preferably by way of a differentiation, in the context of the charge regulation. The actual stroke is preferably ascertained as a function of the charge quantity conveyed to the piezoactuator, in particular as a function of a voltage at a capacitor that is impinged upon by a portion of the current conveyed to the piezoactuator. Charge regulation of this kind makes possible extremely accurate and reliable activation of the piezoactuator, so that errors that could not be compensated for by precontrol alone are compensated for by the charge regulation.

In a particularly advantageous development of the present invention, the charge regulation is combined with a voltage regulation. Preferably the setpoint generated by the precontrol operation is combined with the voltage that is present at the piezoactuator. It is possible in this fashion, especially in the context of insufficiently fast charge regulation, to achieve high accuracy in the method according to the present invention even in this case.

The present invention also relates to a computer program that is suitable for carrying out the above method when it is executed on a computer. It is particularly preferred in this context if the computer program is stored on a memory medium, in particular on a flash memory.

The subject matter of the present invention is also a control and/or regulating device for operating an internal combustion engine. In order to allow the internal combustion engine to be operated optimally in terms of performance and emissions, it is proposed that the control and/or regulating device encompass a memory on which a computer program of the aforesaid kind is stored.

The present invention further relates to an internal combustion engine having a combustion chamber and having a fuel injection apparatus which encompasses a piezoactuator and through which fuel enters into the combustion chamber. To allow the internal combustion engine to be operated optimally in terms of performance and emissions, it is proposed that it encompass a control and/or regulating device of the aforesaid kind.

Further features, possible applications, and advantages of the present invention are evident from the description below of exemplified embodiments of the invention, which are depicted in the Figures of the drawings. All features described or depicted, of themselves or in any combination, constitute the subject matter of the present invention, regardless of their internal references and regardless of how they are stated or depicted in the description or the drawings, respectively.

DETAILED DESCRIPTION OF EXAMPLE EMBODIMENTS

Figure 1:
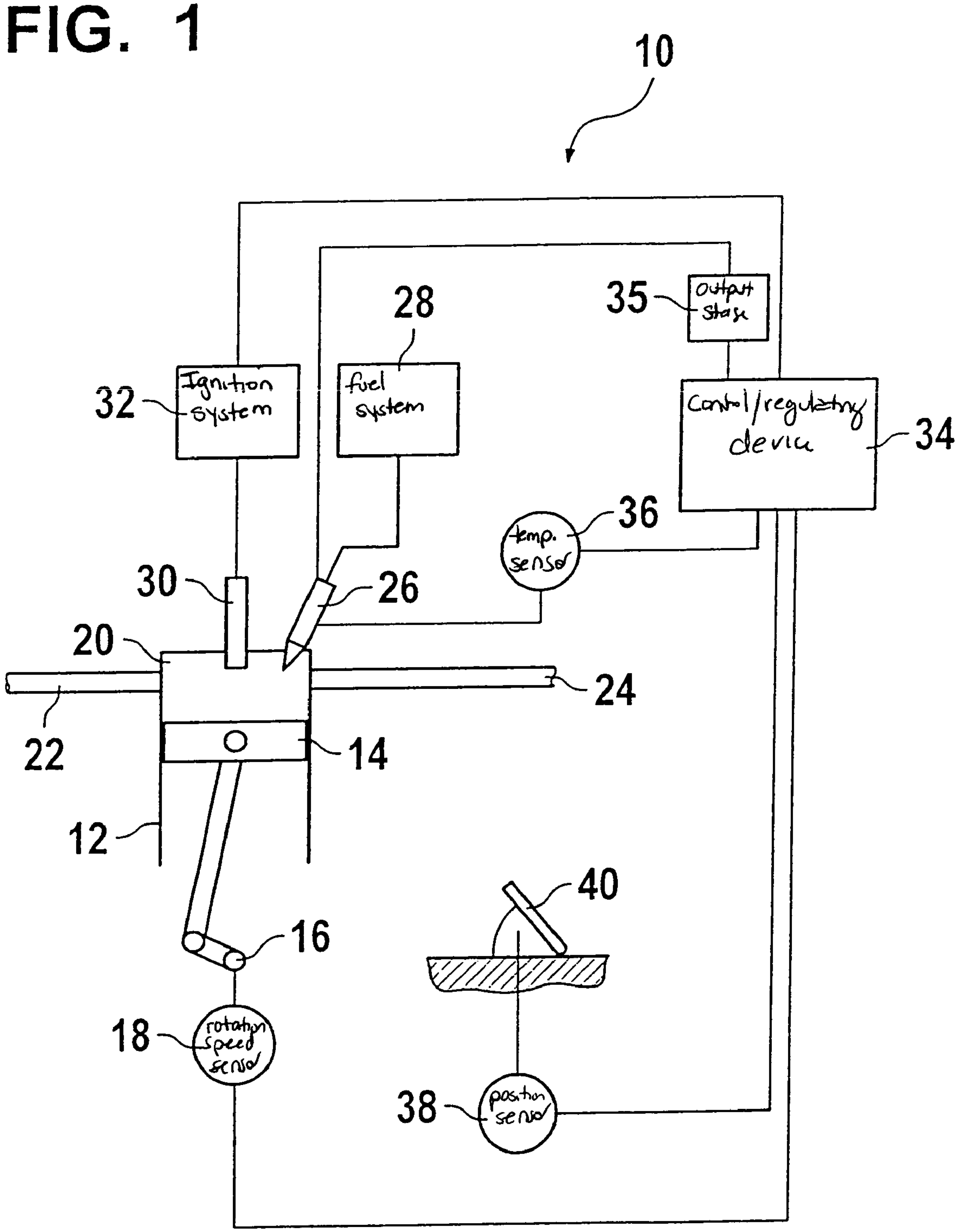
FIG. 1 is a schematic depiction of an example embodiment of an internal combustion engine according to the present invention.

FIG. 1 depicts an internal combustion engine 10 that is built into a motor vehicle. Internal combustion engine 10 encompasses several cylinders, of which FIG. 1 depicts only one cylinder 12. Received in it is a piston 14 which drives a crankshaft 16. The rotation speed of crankshaft 16 is picked off by a rotation speed sensor 18.

Combustion air is conveyed to a combustion chamber 20 of cylinder 12 through an intake duct 22 and an intake valve (not depicted in FIG. 1). The combustion exhaust gases are discharged from combustion chamber 20 through an exhaust duct 24 that is connected to combustion chamber 20 via an exhaust valve (also not depicted in FIG. 1). Fuel is injected directly into combustion chamber 20 via a fuel injection apparatus embodied as injector 26. Injector 26 is connected to a fuel system 28 which is depicted only symbolically in FIG. 1. It encompasses a fuel reservoir, a pre-supply pump, a main delivery pump, and a fuel collection line (rail) in which the fuel is stored under high pressure. Injector 26 is connected to the fuel rail and is built into cylinder 12 of internal combustion engine 10.

The fuel present in combustion chamber 20 is ignited by a spark plug 30. The latter obtains the energy necessary for ignition from an ignition system 32. Ignition system 32 is in turn activated by a control and/or regulating device 34. The latter is also connected at the output end via an output stage 35 to injection 26, and activates it. On the input side, control and/or regulating device 34 receives signals from a temperature sensor 36 that senses the temperature of injector 26. Rotation speed sensor 18 is moreover also connected to control and/or regulating device 34. A position sensor 38 which picks off the position of an accelerator pedal 40 also furnishes signals to control and/or regulating device 34.

Control and/or regulating device 34 can be constructed as an analog electronic circuit. Control and/or regulating device 34 preferably has a computer, for example a microprocessor with flash memory. Control and/or regulating device 34 is furthermore connected to the sensors and actuators already described, so that it can process their signals and generate signals to activate them. A computer program having a plurality of program instructions is stored on the flash memory. The computer program is suitable for carrying out the method described below when it is executed on the microprocessor.

Figure 2:
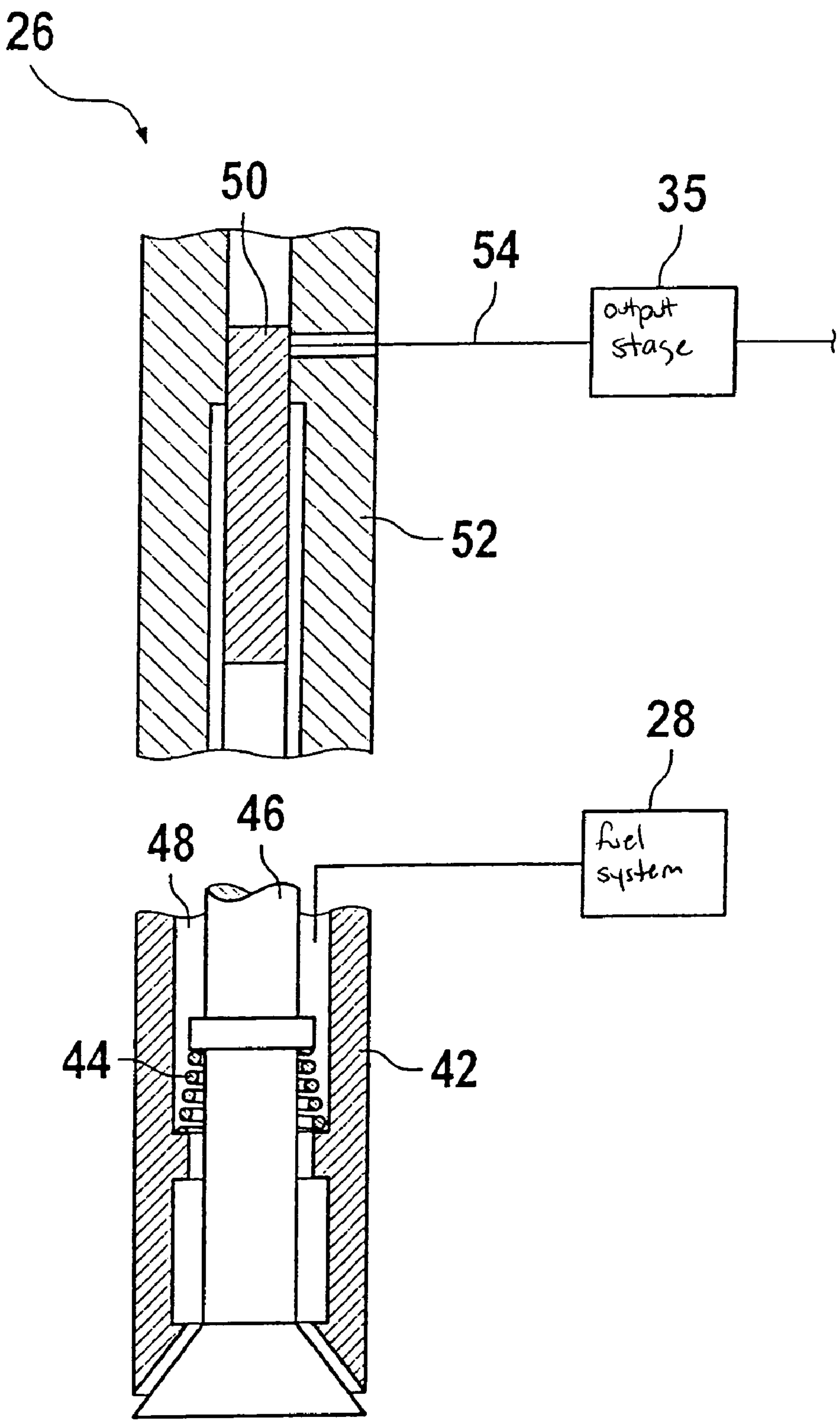
FIG. 2 is a partially sectioned depiction of an example embodiment of a fuel injection apparatus for the internal combustion engine of FIG. 1.

FIG. 2 depicts injector 26 in more detail. It encompasses a valve body 42 in which a valve needle 46, surrounded by an annular chamber 48, is displaceably housed. Valve needle 46 opens "outward," i.e., into the combustion chamber. Valve needle 46 is embodied conically at its free end and sits on a corresponding valve seat. When valve needle 46 is in the open state, fuel system 28 is connected via annular chamber 48 to the combustion chamber. The result, in this open state, is a conical stream of fuel directed into the combustion chamber.

The end of valve needle 46 facing away from the conical configuration is coupled immovably to a piezoactuator 50. A hydraulic coupling is also possible, if applicable. Piezoactuator 50 is a column constructed in layers from a plurality of individual piezoelements. The end of piezoactuator 50 facing away from valve needle 46 is joined by clamping to a housing 52 of the injector. Piezoactuator 50 is connected via control leads 54 to output stage 35. By way of the latter, the activation energy necessary for a motion of piezoactuator 50 is conveyed (in a manner described below) to piezoactuator 50.

Internal combustion engine 10 operates with direct fuel injection, i.e., it can be operated in both stratified and homogeneous mode. In stratified mode, an ignitable fuel mixture is present only in the region of spark plug 30, whereas fuel is at least largely absent from the remaining portion of combustion chamber 20. This is achieved by the fact that injector 26 injects fuel during a compression stroke of piston 14. It is also possible, however, for fuel to be injected by injector 26 during an intake stroke of piston 14, the result being that fuel is present in combustion chamber 20 of internal combustion engine 10 in largely homogeneous fashion. Other combinations are also possible.

In order to perform an injection operation, injector 26 has an electrical activation energy impinged upon it via output stage 35 by control and/or regulating device 34. The result of this is that piezoactuator 50 becomes longer in the longitudinal direction. This causes valve needle 46 to lift off from its valve seat on valve body 42, so that valve needle 46 transitions into its open state. When the injection operation is to be terminated, impingement of the activation energy upon piezoactuator 50 is terminated, so that the latter once again assumes its original length and valve needle 46 comes into contact with its valve seat. This closing motion can be assisted by a spring 44.

The change in length of piezoactuator 50 that it experiences when an electrical voltage is applied to it depends, however, not only on the magnitude of the electrical voltage but also on several other variables. These variables influence the operating behavior of piezoactuator 50 and are therefore referred to as "influencing variables." One such influencing variable, for example, is temperature T of piezoactuator 50. This is sensed by temperature sensor 36 and transmitted to control and regulating device 34. Alternatively, the temperature can also be ascertained from a model.

A further influencing variable is the age of piezoactuator 50. This is to be understood not only as the chronological age—which can be measured, e.g., in days, months, and/or years—but also as the number of strokes that piezoactuator 50 has already performed in the course of its life. The production tolerance with which piezoactuator was manufactured constitutes a further influencing variable. Because of a variety of conditions during the manufacture of piezoactuator 50, it may happen that at the same activation energy and with inherently identical piezoactuators, the latter nevertheless execute different strokes.

The aforesaid influencing variables can be taken into account and compensated for by generating, with the aid of an individual-cylinder precontrol operation, a precontrol setpoint Usetpointpre for the activation voltage of piezoactuator 50. A precontrol operation of this kind is described in German Patent Application No. DE 101 48 217.5 (0607 0840, R. 40438) described above.

Figure 3:
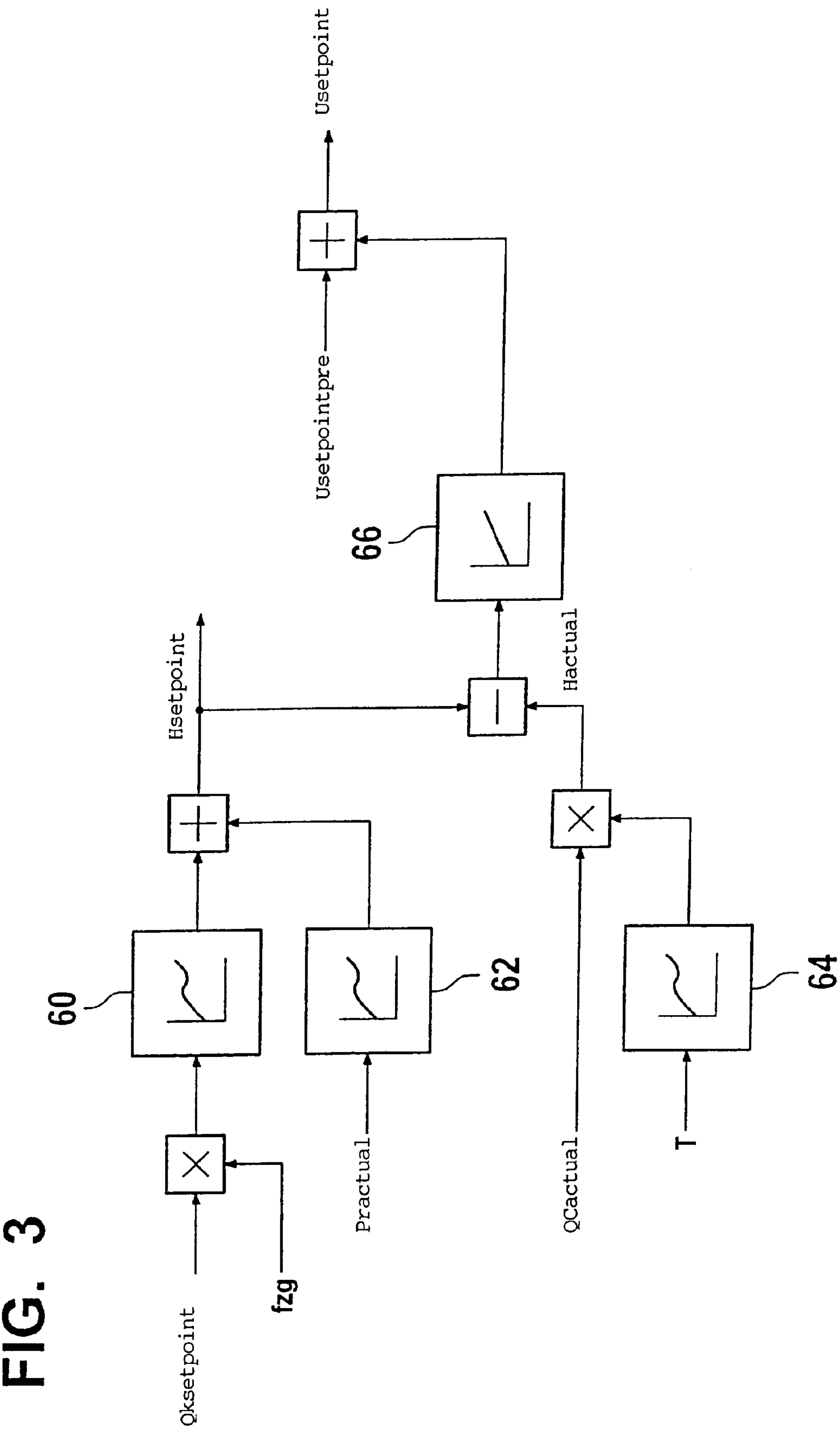
FIG. 3 shows an example embodiment of a method according to the present invention according to which the internal combustion engine of FIG. 1 and the fuel injection apparatus of FIG. 2 are operated.

A method for individual-cylinder regulation of the activation voltage of piezoactuator 50 is depicted in FIG. 3, which indicates the aforementioned precontrol setpoint Usetpointpre for the activation voltage of piezoactuator 50. This precontrol setpoint Usetpointpre can be ascertained not only in the aforementioned manner described in German Patent Application No. DE 101 48 217.5, but also in any other fashion.

In FIG. 3, a flow setpoint QKsetpoint for the fuel, which is ascertained in individual-cylinder fashion, e.g., as a function of the rotation speed and/or of the load applied to internal combustion engine 10, is defined. Flow setpoint QKsetpoint characterizes that mass or quantity of fuel that instantaneously is to be injected, per unit time, into the respective cylinder 12 of internal combustion engine 10.

This flow setpoint QKsetpoint is corrected in individual-cylinder fashion using a factor fzg generated by a so-called cylinder equalization operation. In this cylinder equalization, the accelerations of crankshaft 16 after ignition of the mixture in the individual cylinders is measured. From the deviations between different cylinders, conclusions can be drawn as to differently injected fuel quantities and therefore differing strokes of individual piezoactuators 50 in the context of inherently identical activation energy. Those differences are compensated for by correcting the activation energy for the individual piezoactuators 50 in order to obtain a maximally uniform torque profile within a working stroke of crankshaft 16. This correction is accomplished using factor fzg, which is combined multiplicatively with flow setpoint QKsetpoint. It is understood that the cylinder equalization just described can also be embodied differently or can be entirely absent.

The corrected flow setpoint QKsetpoint is then converted, by a characteristic curve 60, into the needle stroke required in order for the desired fuel quantity to be injected by injector 26 into combustion chamber 20. That needle stroke is combined additively with a pressure-dependent value that is ascertained via a characteristic curve 62 as a function of the measured pressure PRactual in the fuel rail of fuel system 28. The latter represents a pressure-dependent correction of the needle stroke of injector 26.

In this fashion, a reference stroke Hsetpoint for valve needle 46 of injector 26 is generated. This reference stroke Hsetpoint can also be used, inter alia, in the context of the aforementioned precontrol operation, so that precontrol setpoint Usetpointpre can be a function of that reference stroke Hsetpoint.

A portion of the current with which piezoactuator 50 of injector 26 is impinged upon is conveyed (in a manner not depicted) to a capacitor, for example in the form of a parallel circuit. During the switched-on time of this current, i.e., while piezoactuator 50 is being activated, this capacitor is therefore also being charged. After each switched-on time, the voltage at the capacitor represents a value for the charge quantity conveyed to piezoactuator 50. This value is indicated in FIG. 3 as actual charge quantity value QCactual. This charge measurement is performed successively for each switched-on time of piezoactuator 50, so that for each conveyance of a charge quantity to piezoactuator 50, an associated actual charge quantity value QCactual is present.

Actual charge quantity value QCactual is converted, using a characteristic curve 64, into a actual stroke Hactual. For this purpose, characteristic curve 64 represents the correlation between the conveyed charge quantity and the stroke, resulting therefrom, of valve needle 46 of injector 26, as a function of temperature T of injector 26. Temperature T is measured by temperature sensor 36, and the output signal generated by characteristic curve 64 is combined multiplicatively with actual charge quantity value QCactual.

The difference between reference stroke Hsetpoint and actual stroke Hactual is conveyed to a PI controller 66. With this PI controller 66, an individual-cylinder charge regulation operation is performed. This is achieved by additively combining the output signal of PI controller 66 with the precontrol operation described above. The output signal of PI controller 66 is thus added to precontrol setpoint Usetpointpre for the activation voltage of piezoactuator 50.

The result obtained is a setpoint Usetpoint with which piezoactuator 50 is activated. This activation is accomplished, as explained, via an output stage with which, inter alia, setpoint Usetpoint is converted into a current value or, in particular, into a threshold value for the current to piezoactuator 50.

Setpoint Usetpoint is thus influenced by the output signal of PI controller 66, with the consequence that the current conveyed to piezoactuator 50 is modified. This simultaneously represents a modification of the charge quantity conveyed to piezoactuator 50, which in turn is ascertained by way of the aforementioned capacitor in the form of a subsequent actual charge quantity value. The control loop is thereby closed.

Overall, therefore, the method depicted in FIG. 3 thus contains a precontrol operation for the activation of piezoactuator 50 that is supplemented by a charge regulation operation. The method described is embodied in individual-cylinder fashion, and a cylinder equalization operation can additionally be present.

One prerequisite for the method described above with reference to FIG. 3 is that the charge measurement, i.e., the determination of actual charge quantity value QCactual, must be performed with sufficient accuracy and speed. If the charge measurement is not sufficiently accurate, it is then possible to compensate for this by averaging the successive charge measurements, i.e., the successive actual charge quantity values. If the charge measurement is not sufficiently fast, this can be compensated for by way of the method explained below with reference to FIG. 4.

Figure 4:
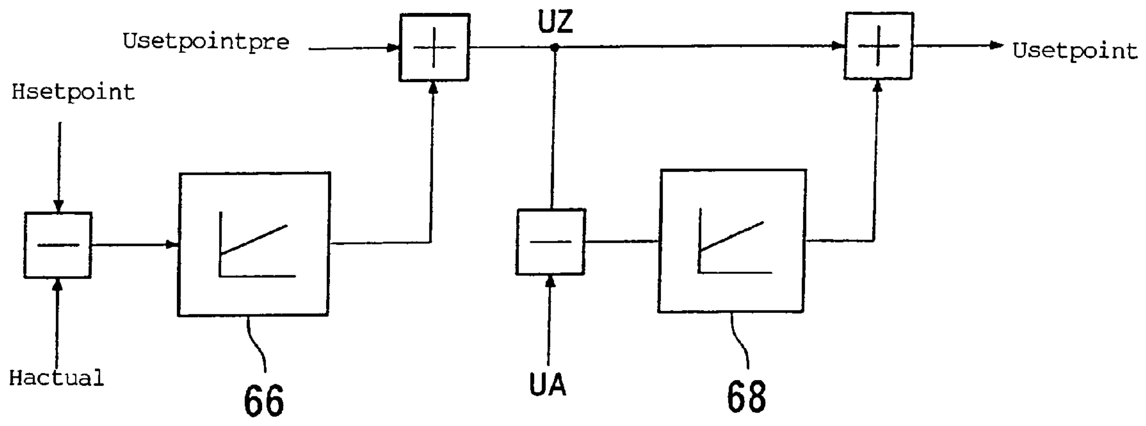
FIG. 4 shows an example embodiment of a supplement to the method of FIG. 3.

FIG. 4 shows a supplement to the method of FIG. 3. In FIG. 4 as in FIG. 3, the output signal of PI controller 66 is additively combined with precontrol setpoint Usetpointpre for the activation voltage of piezoactuator 50. The result of this addition constitutes a voltage UZ. A difference is then calculated between this voltage UZ and a voltage UA. Voltage UA is the actual value of the voltage present at piezoactuator 50, which in turns depends on the current or the charge quantity conveyed to piezoactuator 50.

The difference between voltages UZ and UA is conveyed to a further PI controller 68. An individual-cylinder voltage regulation operation is performed with this PI controller 68. This is achieved by additively combining the output signal of PI controller 68 with the precontrol operation described above, by adding the output signal of PI controller 68 to voltage UZ. The result obtained is setpoint Usetpoint with which piezoactuator 50, as explained, is activated.

Setpoint Usetpoint is thus influenced by the output signal of PI controller 68, with the consequence that the current conveyed to piezoactuator 50 is modified. This simultaneously constitutes a modification of voltage UA present at piezoactuator 50. The control loop is thus closed.

Overall, therefore, the method depicted in FIGS. 3 and 4 contains a precontrol operation for the activation of piezoactuator 50 that is supplemented by a charge regulation operation and a subordinate voltage regulation operation.

What is claimed is:

1. A memory medium on which is stored a computer program which is programmed in such a way that when it is executed, a method is executed, the method comprising:

generating a precontrol setpoint for activating the piezoactuator, wherein activation of the piezoactuator results in a motion of a valve needle;

combining the precontrol setpoint with a charge regulation of a charge quantity conveyed to the piezoactuator; and combining the charge regulation, a reference stroke and an actual stroke of the valve needle of the injector with one another.

2. A control and/or regulating device comprising:

an arrangement configured to generate a precontrol setpoint for activating a piezoactuator of a fuel injector, wherein activation of the piezoactuator results in a motion of a valve needle;

an arrangement configured to combine the precontrol setpoint with a charge regulation of a charge quantity conveyed to the piezoactuator; and an arrangement configured to combine the charge regulation, a reference stroke and an actual stroke of the valve needle of the injector with one another.

3. An internal combustion engine for a motor vehicle, comprising:

a control device configured to generate a precontrol set point for activating a piezoactuator of a fuel injector, wherein activation of the piezoactuator results in a motion of a valve needle, and configured to combine the precontrol setpoint with a charge regulation of a change quantity conveyed to the piezoactuator, and configured to combine the charge regulation, a reference stroke and an actual stroke of the valve needle of the injector with one another.

4. A method for operating an internal combustion engine, in which fuel is injected by an injector into a combustion chamber, the injector having an activatable piezoactuator, the method comprising:

generating a precontrol setpoint for activating the piezoactuator, wherein activation of the piezoactuator results in a motion of a valve needle;

combining the precontrol setpoint with a charge regulation of a charge quantity conveyed to the piezoactuator; and combining the charge regulation, a reference stroke and an actual stroke of the valve needle of the injector with one another.

5. The method as recited in claim 1, wherein an output signal of the charge regulation is combined additively with the precontrol setpoint.

6. The method as recited in claim 1, wherein the charge regulation, the reference stroke and the actual stroke are combined by differentiation.

7. The method as recited in claim 1, further comprising:

ascertaining the reference stroke from a flow setpoint which represents mass or quantity of fuel that is to be injected per unit time.

8. The method as recited in claim 1, further comprising:

ascertaining the precontrol setpoint as a function of the reference stroke.

9. The method as recited in claim 1, wherein the charge regulation is controlled by a PI controller.

10. The method as recited in claim 1, further comprising:

ascertaining the actual stroke as a function of the charge quantity conveyed to the piezoactuator.

11. The method as recited in claim 10, further comprising:

ascertaining the charge quantity conveyed to the piezoactuator as a function of a voltage at a capacitor that is impinged upon by a portion of current conveyed to the piezoactuator.

12. The method as recited in claim 1, wherein the charge regulation is combined with a voltage regulation.

13. The method as recited in claim 12, wherein the voltage regulation is subordinate to the charge regulation.

14. The method as recited in claim 12, wherein a voltage generated by the charge regulation is combined with an actual value of a voltage present at the piezoactuator.

15. The method as recited in claim 14, wherein the voltage regulation is controlled by a PI controller.

* * * * *

UNITED STATES PATENT AND TRADEMARK OFFICE

CERTIFICATE OF CORRECTION

PATENT NO. : 6,968,829 B2
APPLICATION NO. : 10/766668
DATED : November 29, 2005
INVENTOR(S) : Klaus Joos et al.

It is certified that error appears in the above-identified patent and that said Letters Patent is hereby corrected as shown below:

Column 7, line 25, change “claim 1” to --claim 4--

Column 7, line 28, change “claim 1” to --claim 4--

Column 8, line 1, change “claim 1” to --claim 4--

Column 8, line 5, change “claim 1” to --claim 4--

Column 8, line 9, change “claim 1” to --claim 4--

Column 8, line 11, change “claim 1” to --claim 4--

Column 8, line 20, change “claim 1” to --claim 4--

Signed and Sealed this

Twentieth Day of February, 2007

JON W. DUDAS
*Director of the United States Patent and Trademark Office*